United States Patent [19]

Krenz

[11] Patent Number: 5,010,426
[45] Date of Patent: Apr. 23, 1991

[54] INSTALLATION MECHANISM FOR REMOVABLE COMPUTER DRIVE MODULE

[75] Inventor: Horst M. Krenz, Bridgman, Mich.

[73] Assignee: Zenith Data Systems Corporation, Mt. Prospect, Ill.

[21] Appl. No.: 306,613

[22] Filed: Feb. 3, 1989

[51] Int. Cl.$^5$ .............................................. G11B 17/04
[52] U.S. Cl. .............................. 360/97.01; 360/99.06; 360/137; 360/97.02; 360/86; 361/391; 369/75.1; 364/708
[58] Field of Search ...................... 360/137, 86, 97.01, 360/99.06, 98.01; 364/708; 369/75.1; 361/390–394, 415, 399, 392

[56] References Cited

U.S. PATENT DOCUMENTS

| | | | |
|---|---|---|---|
| 2,735,965 | 2/1956 | Balanda | 361/391 |
| 2,944,864 | 7/1960 | Krivulka | 361/391 |
| 4,230,351 | 10/1980 | Bisbing | 292/223 X |
| 4,272,794 | 6/1981 | Skarky | 360/99.06 |
| 4,368,495 | 1/1983 | Hamanaka et al. | 360/99.06 |
| 4,633,350 | 12/1986 | Hanson | 360/98 X |
| 4,685,312 | 8/1987 | Lakoski et al. | 70/14 X |
| 4,717,982 | 1/1988 | Toreson | 360/137 X |
| 4,807,292 | 2/1989 | Sorscher | 360/137 |

FOREIGN PATENT DOCUMENTS

| | | | |
|---|---|---|---|
| 59-101078 | 6/1984 | Japan | 360/97.02 |
| 61-267989 | 11/1986 | Japan | 360/137 D |
| 62-76087 | 4/1987 | Japan | 360/137 D |

OTHER PUBLICATIONS

IBM Tech. Disc. Bulletin, vol. 28, No. 12, May 86, pp. 5519–5521, "Spring-Loaded File Rails" by no author.
PC Magazine 9-13-88, Stephanie K. Losee, "Removable Mass Storage: You Can Take It With You".

Primary Examiner—Aristotelis M. Psitos
Assistant Examiner—Alfonso Garcia
Attorney, Agent, or Firm—Dillis V. Allen

[57] ABSTRACT

An installation mechanism for a removable computer drive module with a handle operated automatically engaging dual rack and pinion device. The pinions are carried by the handle which is pivotally mounted adjacent a module receiving opening in a console. The module carries a pair of rails that have the rack gears formed integrally at one end. After the handle is pivoted to an upward position, the module is inserted into the console and pushed forward engaging the handle pinions. Further pushing on the module causes driving engagement between the racks and the pinions forcing the handle to pivot downwardly. The connectors between the module and the console are engaged by grasping and rotating the handle further downwardly driving the module further into the console.

12 Claims, 4 Drawing Sheets

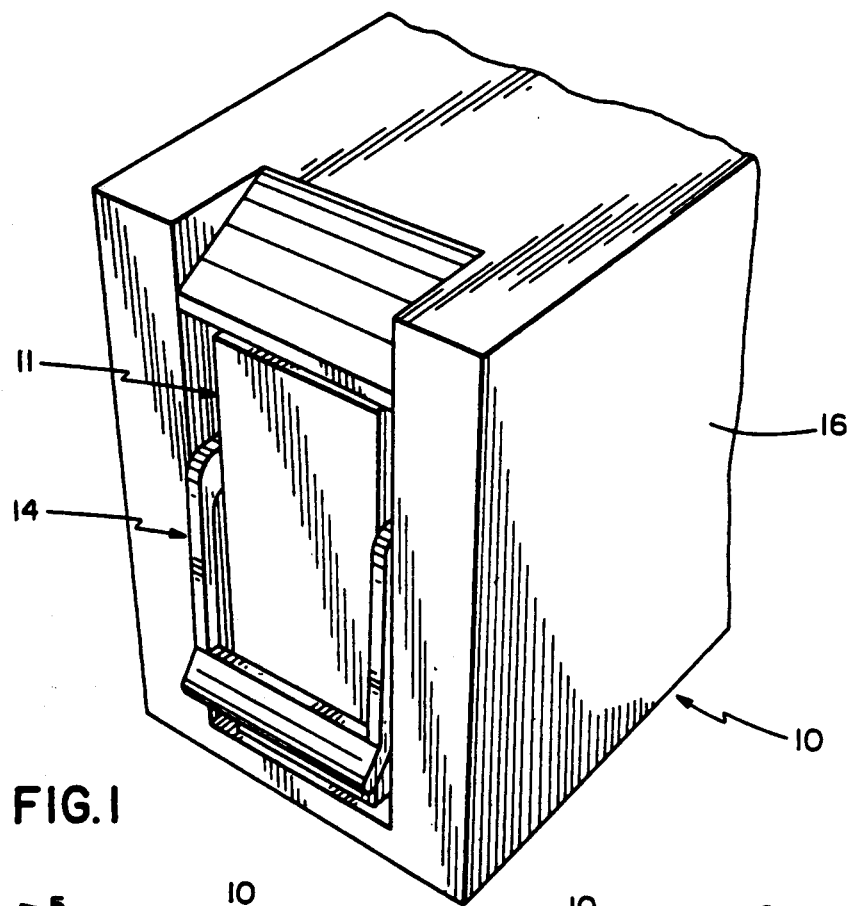
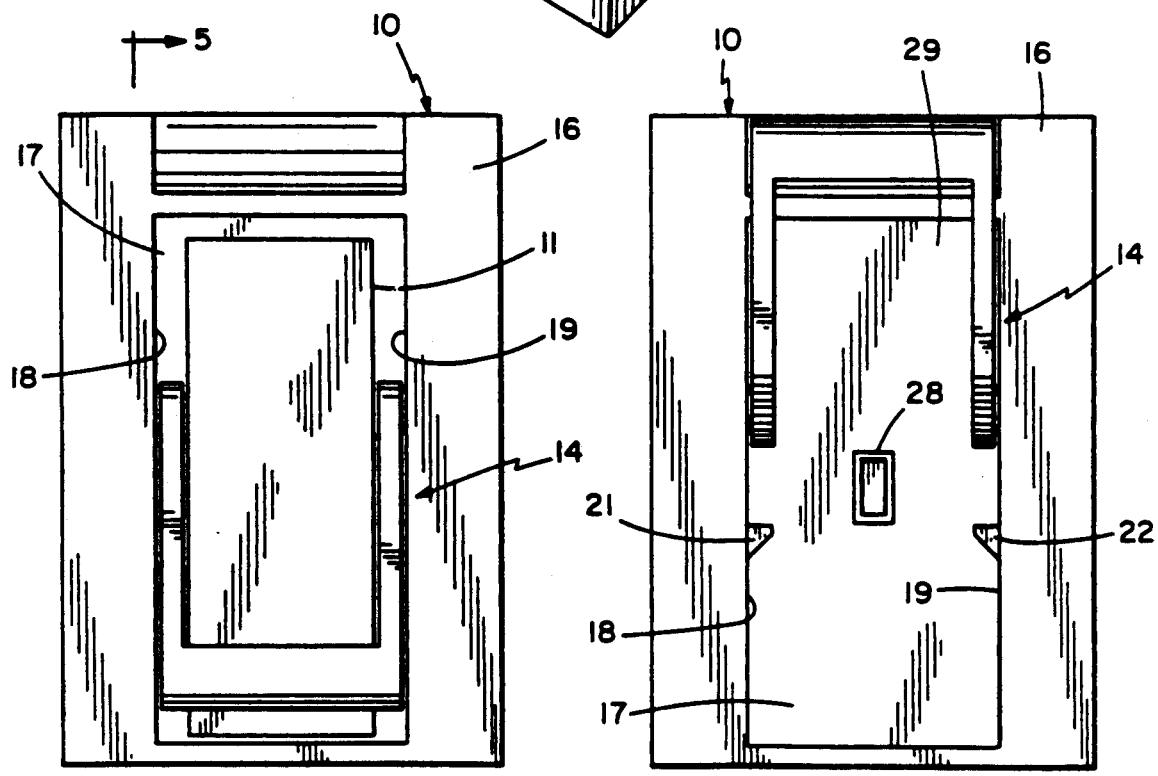
FIG.1
FIG.2
FIG.3

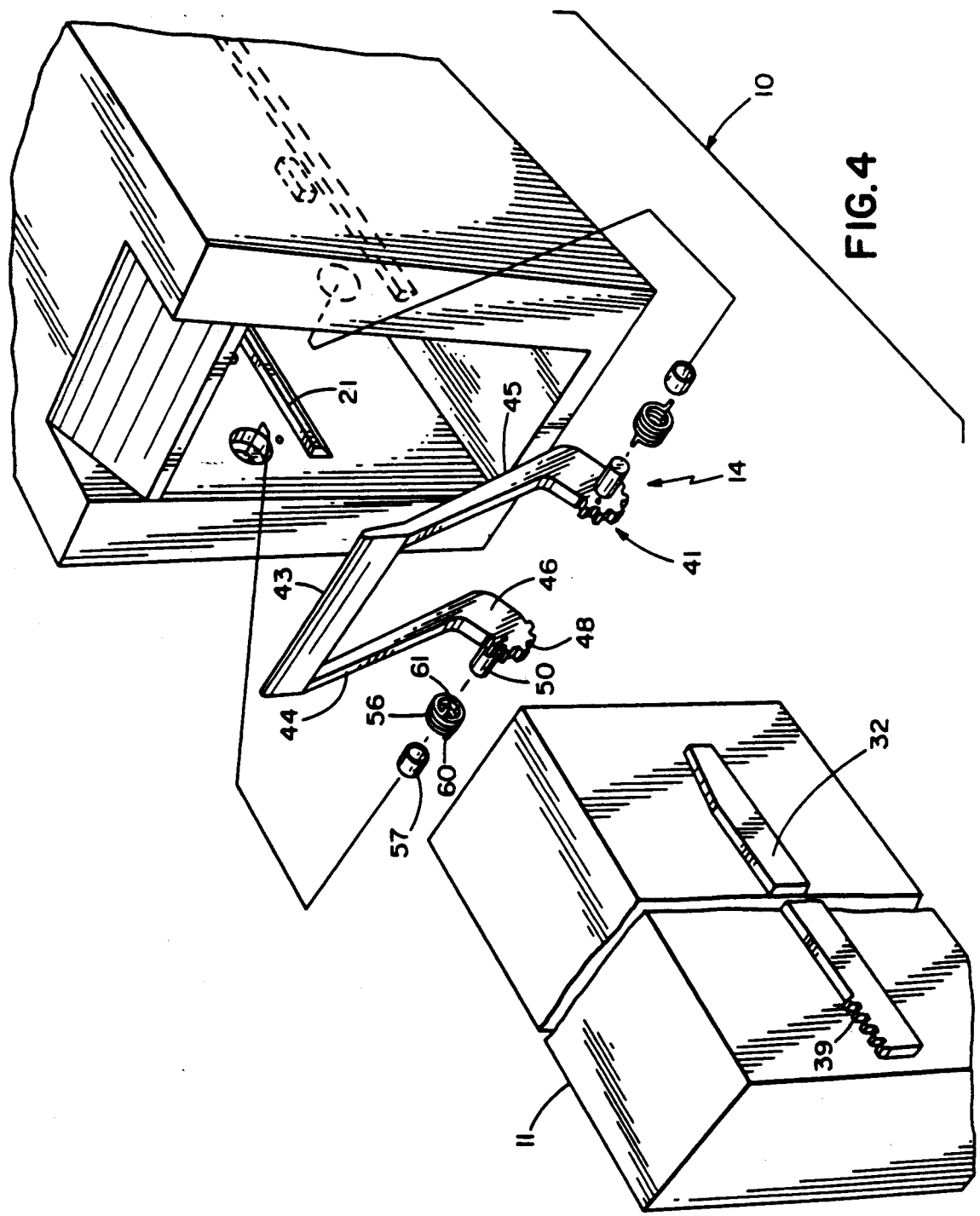

INSTALLATION MECHANISM FOR REMOVABLE COMPUTER DRIVE MODULE

BACKGROUND OF THE INVENTION AND PRIOR ART

Removable computer drive modules have become increasingly popular not only for servicing the drive modules but for transferring data from one computer to another. These drive modules may contain one or a combination of one-half high drives, floppy or hard disks, including 3¼ inch drives with adapters.

Since these modules are usually installed and removed by the operators of the computer, and not repair technicians, it is important that they have the capability of being easily installed without tools, and at the same time be perfectly aligned to engage connectors interfacing the drive module and computer.

Thus, a successful drive-module installation mechanism must have the capability of engaging the module-computer connectors as the module is inserted and breaking the connection as the module is removed and accomplishing both of these tasks in a toolless manner without damaging the connectors in any way.

It should be understood that the present invention is not the first for removably attaching disk drives to computers, and several have been the subject of U.S. patents, including the Bisbing, U.S. Pat. No. 4,230,351; the Hanson, U.S. Pat. No. 4,633,350, and the Toreson, U.S. Pat. No. 4,717,982. These patents show lever system latching mechanism that are satisfactory for many uses, but because lever systems have varying torque characteristics during latching, they lack the smooth operation necessary for easy operator use and also a constant level torque desirable for proper connector engagement and disengagement.

There are also a plurality of removable disk drives described in *PC Magazine*, Sept. 13, 1988, entitled "Removable Mass Storage: You Can Take It With You", but these have the same deficiencies described in the above U.S. patents.

There is also a United States patent application in the name of Horst Krenz, entitled "A Removable Hard Disk Drive Having A Combination Latch, Lever and Handles", U.S. Ser. No. 265,077, Filed Oct. 31, 1988, now U.S. Pat. No. 4,982,303, assigned to the assignee of the present invention that describes and shows a handle operated rack and pinion device on a removable hard drive module where a handle, pinion and rack are entirely mounted on the removable module and operate a latching tongue that engages a cooperating stop adjacent the computer housing opening. In this latching mechanism, the rack and pinion arrangement is continuously engaged. This module latching system is suitable for many purposes, particularly where a handle is desired for carrying the module, but in some cases it overly complicates the module assembly.

It is a primary object of the present invention to ameliorate the problems noted above in installation mechanism for removable drive modules.

SUMMARY OF THE PRESENT INVENTION

In accordance with the present invention, a computer component is provided with a removable drive-module connected and locked by an installation mechanism that includes dual sets of automatically engaging racks and pinions.

The pinions are formed integrally on the arms of a bail-type handle pivotally mounted in the computer component housing, and the racks are conveniently formed integrally with the ends of guide rails already required on the sides of the modules.

Springs bias the bail handle upwardly to a position ready to receive the drive-module, and as it is slid into the component housing a substantial distance, the racks on the module rails engage the handle pinions and rotate the handle down to a position approximately 30 degrees to vertical. In this position, the connectors are aligned but not engaged, and the operator then grasps the handle and rotates it further downwardly causing complete connector engagement as the handle moves to a downward vertical position, where the module is locked in the computer component housing.

Other objects and advantages of the present invention will appear more clearly from the following detailed description.

BRIEF DESCRIPTION OF THE DRAWINGS

FIG. 1 is a fragmentary perspective of the present computer component with the drive-module locked in position;

FIG. 2 is a front view of the computer component illustrated in FIG. 1;

FIG. 3 is a front view of the computer component illustrated in FIGS. 1 and 2 with the drive-module removed;

FIG. 4 is an exploded perspective view of the drive-module, computer component housing and installation assembly;

DETAILED DESCRIPTION OF THE PREFERRED EMBODIMENT

Figure 6:
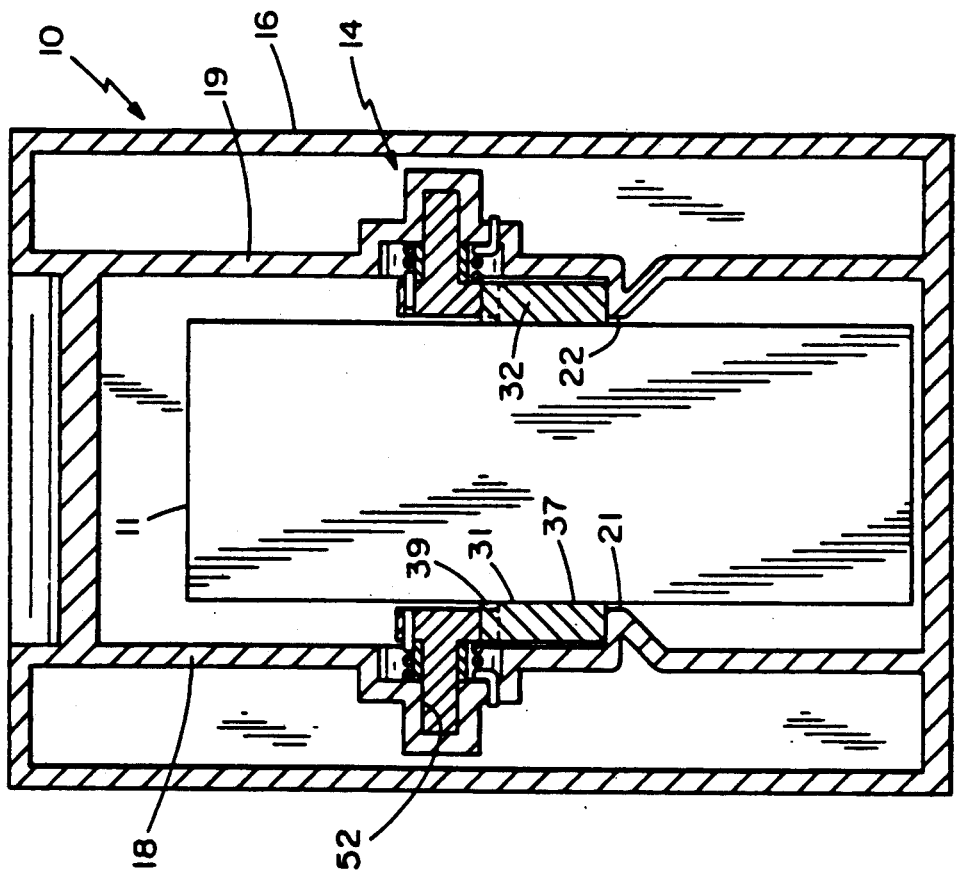
FIG. 6 is a cross-section of the computer component taken generally along line 6–6 of FIG. 5.

Referring to the drawings and particularly FIGS. 1 to 6, a computer component 10 is illustrated having a removable drive-module 11 therein connected and locked by a handle-operated installation mechanism 14.

The computer component 10 includes a generally rectangular housing 16 having a vertically elongated frontal opening 17 therein in part defined by spaced vertical side walls 18 and 19 having parallel elongated guide tracks 21 and 22 formed integrally in side walls 18 and 19. Tracks 21 and 22 may alternatively define slots for receiving the drive-module 11.

A pin connector 28 is mounted centrally on rear wall 29 of housing opening 17 and when engaged with a cooperating pin connector 30 on forward wall 33 of drive-module 11 provides the proper electrical terminal and data interface between drive-module 11 and the associated computer.

Figure 5:
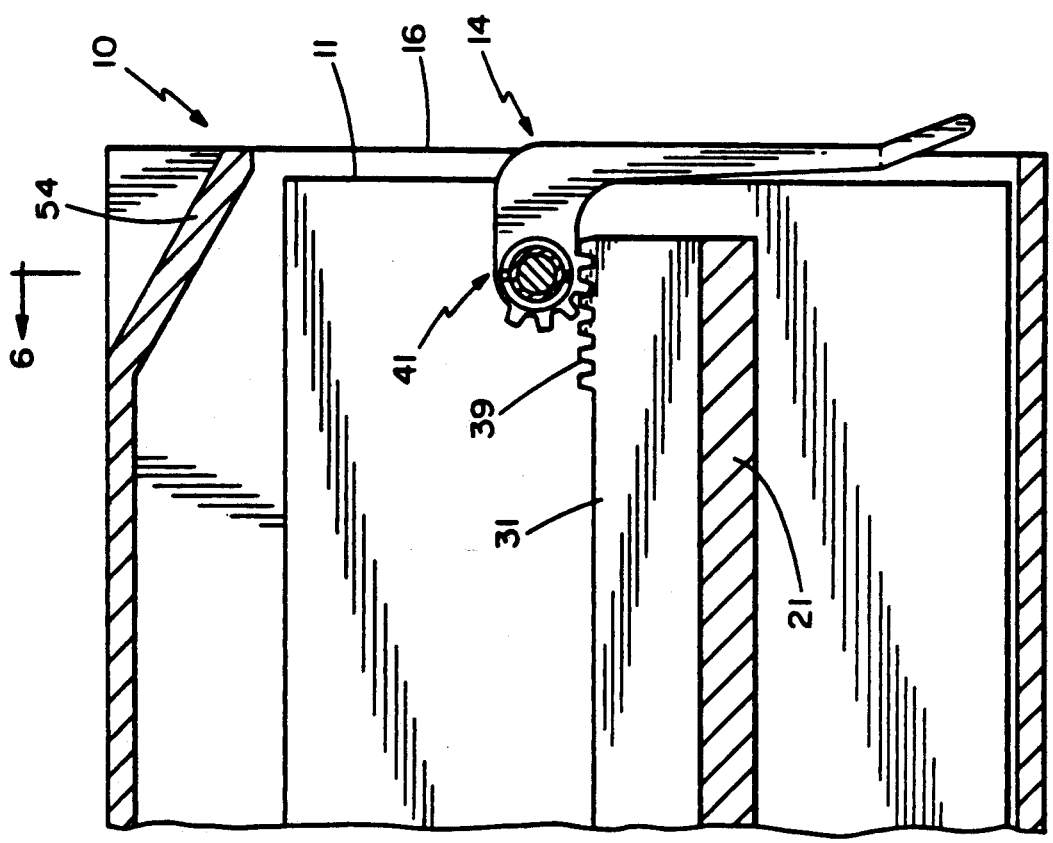
FIG. 5 is a fragmentary longitudinal section with the drive-module in a locked position taken generally along line 5—5 of FIG. 2.

The drive-module 11 is generally rectangular in configuration as seen in FIGS. 4 to 6, vertically elongated, and has a pair of horizontal guide rails 31 and 32 fixed thereto that slidably engage the tracks 21 and 22 in housing 16, as seen clearly in FIG. 6.

The installation mechanism 14 includes a pair of integrally formed rack-gear segments 39 on the rear ends of the guide rails 31 and 32, thereby eliminating any requirement for separate fabrication and installation of the rack gears.

Also as seen in FIGS. 4 to 6, a handle assembly 41 is provided in the installation mechanism 14 and is seen to include a one-piece injection molded bail-type plastic handle 43 having spaced arms 44 and 45 with laterally depending legs 46 having pinion gear teeth segments 48 integrally formed therewith. Legs 46 have outwardly extending integral pins 50 insertable into aligned boss bores 52 integrally formed in housing side walls 18 and 19. Handle arms 44 and 45 are sufficiently flexible so that when squeezed together, pins 50 can be snapped into boss bores 52 during assembly.

Figure 7:
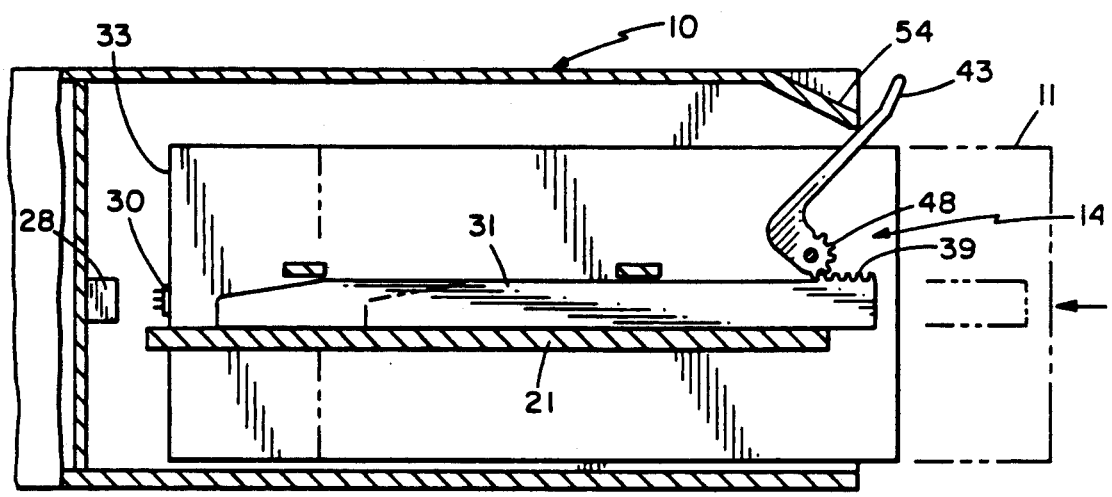
FIGS. 7 to 9 are longitudinal sections of the computer component as the drive-module is inserted, connected and locked.

Handle 43 is biased to its upward "ready" position illustrated in FIGS. 3 and 7, against housing top wall 54 (which acts as a stop), by a pair of short coil compression springs 56 seated on bushings 57 in turn mounted on handle pins 50 as seen in FIGs. 4 and 6. The coil compression springs 56 have oppositely extending ends 60 and 61 that seat in apertures in housing side walls 18, 19 and handle legs 46, that with proper pretension rotate handle 43 to its "ready" position illustrated in FIGS. 3 and 7. Alternatively, a detent mechanism can be used to hold the handle in its "ready" position.

Figure 8:
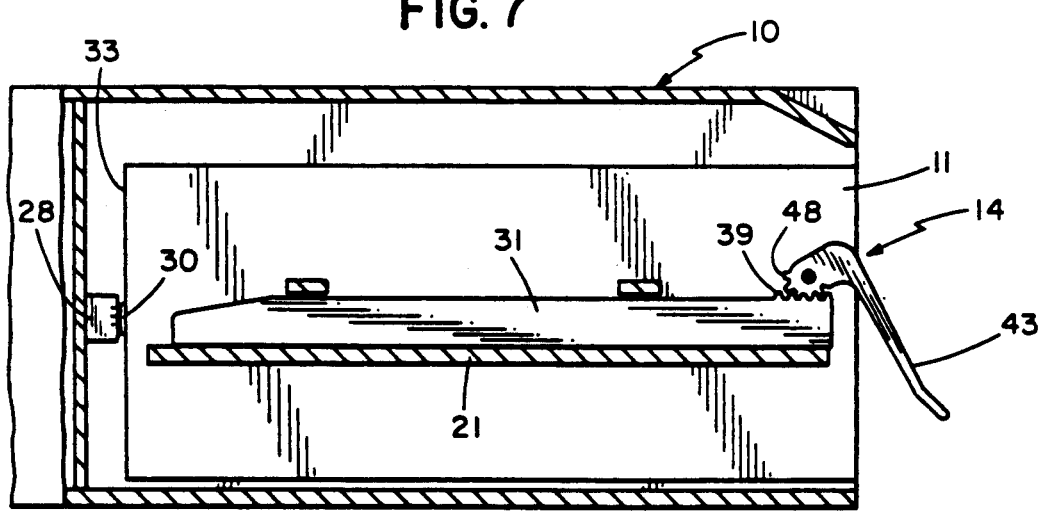
Figure 9:
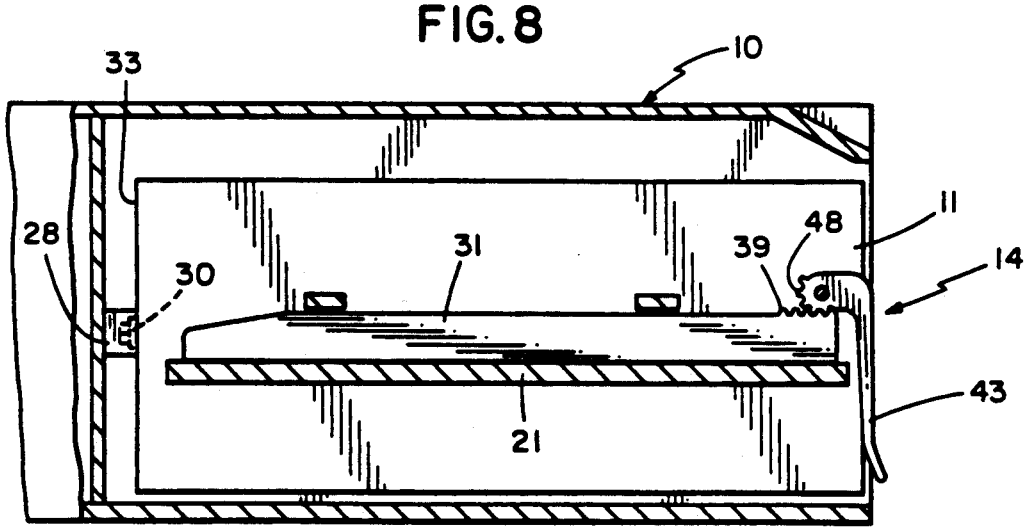

Viewing FIGS. 7 to 9, beginning with FIG. 7, the drive-module 11 is inserted into housing opening 17 by engaging side rails 31 and 32 in tracks 21 and 22 and sliding the module forwardly into the opening until the pinion segments 48 engage the racks 39, and as seen in this position, the module is a substantial distance into the computer housing and thus fully supported by tracks 21 and 22. Without stopping the module 11 is pushed further into housing 16 causing the rack gears 39 to drive the pinions 48 and rotate the handle 43 downwardly to an angle of approximately 30 degrees to vertical as illustrated in FIG. 8, and in this position, connectors 28 and 30 just touch or are slightly short of initial engagement.

Thereafter the operator grasps handle 43 and rotates it downwardly approximately 30 degrees to the downward vertical position illustrated in FIG. 9, providing the increased smooth force necessary to drive the module 11 forwardly and fully engage the connectors 28 and 30 while in full alignment, protecting the connectors against any pin damage.

Module removal is effected reversely by lifting up on handle 43, disengaging the connectors 28 and 30 as module 11 moves rearwardly, and after return to the position illustrated in FIG. 7, module 11 is grasped and slid from the housing 16.

What is claimed is:

1. A computer component with removable drive module, comprising: a computer component housing including an opening with stationary module guide means, a terminal connector in the housing opening, a drive module removably received in the opening and guided therein by the guide means, having a connector fixed thereto releasably engageable with the housing connector, and an installation assembly for engaging the two connectors and holding the module in position in the housing including an automatically engaging handle operated interengaging drive means having a portion thereof on the housing interengaging a portion thereof on the module including means to automatically engage and operate the drive by module movement without handle pressure as the module is pushed along the housing guide means toward a position where the connectors engage so the handle may thereafter be operated to move the connectors to their final engaged positions.

2. A computer component with removable drive module as defined in claim 1, wherein the handle operated interengaging drive means includes at least one rack gear on one of the housing and module and at least one pinion on the other of said housing and module, said handle being connected to operate the pinion.

3. A computer component with removable drive module as defined in claim 1, including at least one rail on the module slidably received by the housing guide means, said handle operated interengaging drive means including at least one rack on one of the guide means and rail and at least one interengaging pinion on the other of said guide means and rail.

4. A computer component with removable drive module comprising: a computer component housing including an opening with stationary module guide means, a terminal connector in the housing opening, a drive module removably received in the opening guided therein by the guide means having a connector fixed thereto releasably engageable with the housing connect, said module having at least one guide rail slidably received by the housing guide means, and an installation assembly for engaging the two connectors and holding the module in the housing. including a handle operated interengaging drive on the housing and the module guide rail including a rack gear on the module guide rail and a pinion on the handle.

5. A computer component with removable drive module comprising: a computer component housing including an opening with stationary module guide means, a terminal connector in the housing opening, a drive module removably received in the opening guided therein by the guide means having a connector fixed thereto releasably engageable with the housing connector, said module having at least one guide rail slidably received by the housing guide means, and an installation assembly for engaging the two connectors and holding the module in the housing including a handle operated interengaging drive on the housing and the module guide rail, wherein the interengaging drive includes at least one rack gear integral with the guide rail and at least one interengaging pinion operated by the handle on the housing, wherein there are two guide rails fixed to the opposite sides of the module slidably received by two tracks on the housing opening defining the guide means, said rails each having a rack gear integral therewith, said handle being a bail-type handle pivotally mounted on the housing having a pair of integral pinions engaging the rail racks.

6. A computer component with removable drive module as defined in claim 5, including a spring biasing the handle to an upward position wherein the module is out of the housing opening in preparation for module entry.

7. A computer with removable drive module comprising: a computed component housing having a front including an opening with stationary module guide means, a connector in the housing opening, a drive module removably received in the opening guided therein by the guide means having a connector fixed thereto releasably engageable with the housing connector, said module having at least one guide rail slidably received by the housing guide means, an installation assembly for engaging the two connectors and holding the module in the housing including at least one rack gear on the module and at least one selectively engageable pinion pivotally supported on the housing, a handle for pivoting for pinion, and spring means biasing said pinion and handle to a position preparatory to receiving the module, said rack gear having a short length and positioned on the module to automatically engage the pinion only after the module has been inserted a substantial distance into the housing, said rack gear also being positioned to partly rotate the pinion after engagement by pushing the module inwardly so that handle rotates partly toward a locked position, said handle being movable thereafter when pressed to drive the rack gear and module inwardly engaging the connectors as the handle moves to its locked position.

8. A computer component with removable drive module as defined in claim 7, including two guide rails each fixed to one side of the module, said guide rails each having an integral rack gear segment at its outer end, said handle being generally "u" shaped in configuration, pivotally mounted to the housing at the front thereof adjacent the opening and having spaced integral arms with pinions engaging the rail rack segments.

9. A computer component with removable drive module as defined in claim 7, wherein said ready position of the handle is an upwardly rotated position and said locked position is a downwardly rotated position.

10. A computer component with removable drive module as defined in claim 8, wherein the handle is pivotally mounted in spaced side bosses in the housing opening, said handle being a one-piece plastic molding with integral pivot pins on the spaced arms, said spaced arms being sufficiently inwardly flexible so the handle pivot pins can be snapped into the housing bosses.

11. A computer component with removable drive module comprising: a computer component housing having a front including an opening with stationary module guide means, a connector in the housing opening, a drive module having sides removably received in the opening guided therein by the guide means having a connector fixed thereto releasably engageable with the housing connector, said module having two guide rails slidably received by the housing means, an installation assembly for engaging the two connectors and holding the module in the housing including a handle pivotally mounted on the housing, spring means biasing said handle to a position preparatory to receiving the module, said guide rails each fixed to one side of the module, and having integral rack gear segments at their ends adjacent the housing front, said handle being generally "U" shaped in configuration, pivotally mounted to the housing at the front thereof adjacent the opening and having spaced integral arms with pinions engaging the guide rails rack segments, the handle being pivotally mounted in spaced side bosses in the housing openings, said being a one-piece plastic molding with integral pivot pins, said spaced arms being sufficiently inwardly flexible so the handle pivot pins can be snapped into the housing bosses.

12. A computer component with removable drive module comprising: a computer component housing having a front including an opening with stationary module guide means, a connector in the housing opening, a drive module having sides removably received in the opening guided therein by the guide means having a connector fixed thereto releasably engageable with the housing connector, said module having two guide rails slidably received by the housing guide means, an installation assembly for engaging the two connectors and holding the module in the housing including a handle pivotally mounted on the housing, spring means biasing said handle to a position preparatory to receiving the module, said guide means each fixed to one side of the module and having integral rack gear segments at their ends adjacent the housing front, said handle being generally "U" shaped in configuration, pivotally mounted to the housing at the front thereof adjacent the opening and having spaced integral arms with pinions engaging the guide rails rack segments, the handle being pivotally mounted in spaced side bosses in the housing opening, said handle being a one-piece plastic molding with integral pivot pins on spaced arms, said spaced arms being sufficiently inwardly flexible so the handle pivot pins can be snapped in the housing bosses, said rack gears having a short length and positioned on the module so that they engage the pinons only after the module has been inserted a substantial distance into the housing and also positioned to partly rotate the handle after engagement by pushing the module inwardly, said handle being moveable thereafter when pressed to drive the rack gears and module engaging the connectors as the handle moves to its locked position.

* * * * *